United States Patent
Elsayed et al.

(10) Patent No.: US 12,141,396 B2
(45) Date of Patent: Nov. 12, 2024

(54) DIFFERENTIAL-DIFFERENCE-AMPLIFIER-BASED TOUCH SENSOR INTERFACE

(71) Applicant: Shenzhen Goodix Technology Co., Ltd., Shenzhen (CN)

(72) Inventors: Mohamed Elsayed, San Diego, CA (US); Cheng Zhu, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/161,901

(22) Filed: Jan. 31, 2023

(65) Prior Publication Data

US 2024/0256084 A1    Aug. 1, 2024

(51) Int. Cl.
G06F 3/041     (2006.01)
G06F 3/044     (2006.01)
H03F 3/45      (2006.01)

(52) U.S. Cl.
CPC ........ G06F 3/04182 (2019.05); G06F 3/0446 (2019.05); H03F 3/45269 (2013.01)

(58) Field of Classification Search
CPC . G06F 3/04182; G06F 3/0446; H03F 3/45269
See application file for complete search history.

(56) References Cited

U.S. PATENT DOCUMENTS

2023/0176668 A1* 6/2023 Ma ...................... G09G 3/2096
                                                        345/204

* cited by examiner

*Primary Examiner* — Yaron Cohen
(74) *Attorney, Agent, or Firm* — Kilpatrick Townsend & Stockton LLP (57) ABSTRACT

Techniques are described for touch event sensing in a capacitive touch panel that is integrated with a display. In some such environments, a large amount of display noise is capacitively coupled with the touch sensing signals. This can degrade performance of conventional sensing approaches, which tend to use a buffering stage followed by a difference amplifier stage. Embodiments provide a single-stage, differential-difference-amplifier-based touch event sensing approach that pre-cancels coupled display noise from adjacent channels by common-mode rejection prior to amplifying, thereby generating amplified differential output signals that include substantially only the desired touch sensing information.

13 Claims, 6 Drawing Sheets

(Prior Art)

DIFFERENTIAL-DIFFERENCE-AMPLIFIER-BASED TOUCH SENSOR INTERFACE

TECHNICAL FIELD

The present document relates to sensing circuits, and, more particularly, to differential-difference-amplifier-based touch sensor interfaces, such as for use in capacitive touch panels.

BACKGROUND

Many modern electronics applications include integrated touch panels, such as touchscreen displays. Typically, touch-sensing layers of a touchscreen display use capacitive sensing to determine when and where a user is touching the display. For example, signals are transmitted through capacitive channels of the touch panel, and the capacitive response of those channels can be measured to determine presence or absence of a touch event local to the channel. However, display noise can couple into the touch-sensing layers, which can manifest as noise in the readout of capacitive touch-sensing information. Over time, there has tended to be a continuing increase in such display noise coupling, and it has become increasingly challenging to provide sufficiently low-noise read-out circuits for such applications.

BRIEF SUMMARY

Embodiments disclosed herein include systems and methods for touch event sensing in a capacitive touch panel that is integrated with a display. In some such environments, a large amount of display noise is capacitively coupled with the touch sensing signals. This can degrade performance of conventional sensing approaches, which tend to use a buffering stage followed by a difference amplifier stage. Embodiments provide a single-stage, differential-difference-amplifier-based touch event sensing approach that pre-cancels coupled display noise from adjacent channels by common-mode rejection prior to amplifying, thereby generating amplified differential output signals that include substantially only the desired touch sensing information (i.e., some residual noise may remain, but the vast majority of coupled display noise is removed).

According to a first set of embodiments, a system is provided for sensing a touch event in a touch panel integrated with a display. The system has a differential difference amplifier (DDA), including: a differential pair of amplifier outputs having a positive output and a negative output, each to output a respective one of a differential pair of output signals; a first differential pair of amplifier inputs having a first positive input and a first negative input, the first positive input coupled with a first channel response signal corresponding to a first capacitive response of a first channel capacitor combined with coupled display noise, and the first negative input coupled with a second channel response signal corresponding to a second capacitive response of a second channel capacitor combined with the coupled display noise; and a second differential pair of amplifier inputs having a second positive input and a second negative input, the second positive input coupled in feedback with the positive output, and the second negative input coupled in feedback with the negative output, such that the differential pair of outputs corresponds to an amplified version of the first capacitive response.

According to another set of embodiments, a display system is provided. The display system includes a touch panel and N−1 differential difference amplifiers (DDAs). The touch panel is for integration with a display and includes N touch sense channels formed by a grid of row lines and column lines, each nth touch sense channel manifesting an nth capacitive response to presence of a touch event local to the nth touch sense channel, N being an integer greater than 1. Each nth DDA of the N−1 DDAs includes: an nth differential pair of amplifier outputs having an nth positive output and an nth negative output, each to output a respective one of an nth differential pair of output signals; an nth first differential pair of amplifier inputs having an nth first positive input and an nth first negative input, the nth first positive input to receive, via the nth touch sense channel, an nth channel response signal indicating the nth capacitive response combined with coupled display noise, and the nth first negative input to receive, via the (n+1)th touch sense channel, an (n+1)th channel response signal indicating the (n+1)th capacitive response combined with coupled display noise; and an nth second differential pair of amplifier inputs having an nth second positive input and an nth second negative input, the nth second positive input coupled in feedback with the nth positive output, and the nth second negative input coupled in feedback with the nth negative output, such that each nth differential pair of outputs corresponds to an amplified version of the nth capacitive response.

According to another set of embodiments, a method is provided for touch event sensing. The method includes generating first and second differential output signals at a differential pair of amplifier outputs by: receiving, at a first of a first differential pair of amplifier inputs via a first touch sense channel of a touch panel, a first channel response signal manifesting a first touch response and a display noise, the first touch response indicating whether there is presence of a touch event local to the first touch sense channel; receiving, at a second of the first differential pair of amplifier inputs via a second touch sense channel of a touch panel, a second channel response signal manifesting a second touch response and the display noise, the second touch response indicating whether there is presence of a touch event local to the second touch sense channel; receiving, at a first of a second differential pair of amplifier inputs via a first voltage divider branch, feedback of the first differential output signal; and receiving, at a second of the second differential pair of amplifier inputs via a second voltage divider branch, feedback of the second differential output signal, such that the first and second differential output signals include an amplified version of the first touch response with the display noise at least partially canceled.

The drawings, the description and the claims below provide a more detailed description of the above, their implementations, and features of the disclosed technology.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Many modern electronics applications include integrated touch panels, such as touchscreen displays. Typically, touch-sensing layers of a touchscreen display use capacitive sensing to determine when and where a user is touching the display. Display noise can couple into the touch-sensing layers, which can manifest as noise in the readout of capacitive touch-sensing information. Over time, there has tended to be a continuing increase in such display noise coupling, and it has become increasingly challenging to provide sufficiently low-noise read-out circuits for such applications.

Figure 1:
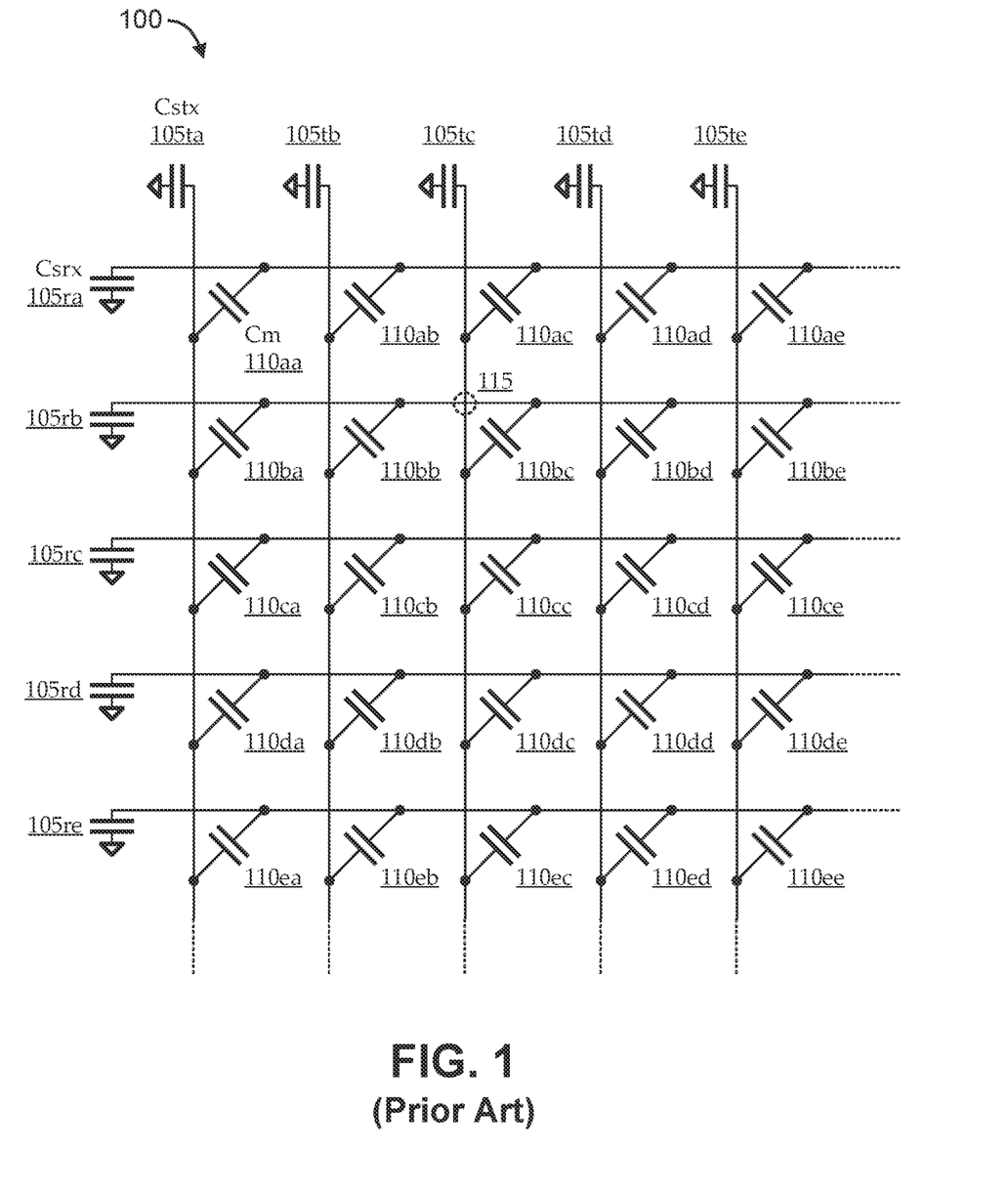
FIG. 1 shows a simplified portion of an illustrative conventional touch panel array having rows and columns.

FIG. 1 shows a simplified portion of an illustrative conventional touch panel array 100 having rows and columns. In general, the touch panel array 100 is configured to sense when and where a user touches the array by sensing a change in capacitance and associating the sensed change to a particular row-column intersection location. A "mutual capacitor" (Cm) 110 is located at each row-column intersection location. Additionally, each row line and each column line of the array 100 can be considered as coupled with a respective "self-capacitor" (Cs) 105. The row-wise self-capacitors are labeled "Csrx", and the column-wise self-capacitors are labeled "Cstx." The self-capacitors 105 are not discrete physical components; rather, they represent an aggregated parasitic capacitance associated with the corresponding row line or column line of the array 100. For example, the touch panel array 100 is integrated with (e.g., sits above) a display, and display noise from the display capacitively coupled with each row and column line of the touch panel array 100 via the respective self-capacitors 105.

The grid of row lines and column lines effectively provides a number of touch sense channels. In some cases, the touch panel array 100 includes tens (e.g., at least 20) touch sense channels. Each touch sense channel has a respective channel capacitance, which includes self-capacitance of the channel, mutual capacitance of the channel, and any additional capacitance manifesting on the channel due to presence of a local touch event. As used herein, a "local" touch event relative to a particular channel can be any touch interaction with the touch panel that manifests as a measurable mutual capacitive response on the particular channel. Both self-capacitance and mutual capacitance of a touch sensing channel can be measured to sense local touch events at corresponding locations on the touch panel array 100.

As noted above, each mutual capacitor 110 is coupled between a corresponding column line and a corresponding row line. In context of mutual capacitor-based sensing, each "touch sense channel" corresponds to a particular mutual capacitor 110 and includes the particular column line and row line coupled with that mutual capacitor 110. To measure the mutual capacitance of a particular touch sense channel, the corresponding column line is driven with a drive signal (e.g., a sinusoid) and the drive signal is received as a channel response signal from the corresponding row line after the signal passes through the mutual capacitor 110 coupled between the row and column lines. The received channel response signal is essentially a version of the drive signal as affected by the channel capacitance of the touch sense channel being measured. While the channel capacitance includes contributions from self-capacitance (i.e., both row-wise and column-wise contributions), the channel capacitance is dominated by the mutual capacitance and any changes to effective mutual capacitance due to presence or absence of a local touch event. As such, a particular change in the channel response signal primarily indicates a corresponding change in mutual capacitance of the touch sense channel, which can indicate presence or absence of a touch event. For example, a touch event occurring (e.g., a finger being placed) at the circled row-column intersection location 115 can cause a detectable change in capacitance relating to mutual capacitor 110bc (e.g., and also a small change in capacitance of row-wise self-capacitor 105rb and column-wise self-capacitor 105tc).

The mutual capacitors 110 in the touch panel array 100 tend to be the primary sensing elements because they tend to provide more accurate information regarding touch (e.g., finger) locations. Still, self-capacitor 105 sensing can provide a useful alternative (or supplemental) source of touch-sensing information, especially for cases in which mutual-capacitor 110 sensing tends to be inaccurate (e.g., when a user has wet fingers). However, self-capacitor 105 sensing can be more challenge, due to smaller signal levels than those obtained with mutual capacitor 110 sensing. The change in capacitance induced in a self-capacitor 105 during a touch even may typically be only a small fractional of its base capacitance value. For example, there may typically be less than a 0.1-percent difference in measured capacitance between a touch and a non-touch condition. To reliably sense such a small change in capacitance, sensing circuits can be designed to effectively cancel the base capacitance value with sufficiently low read-out noise. While several conventional approaches exist, those approaches tend to have limitations.

Figure 2:
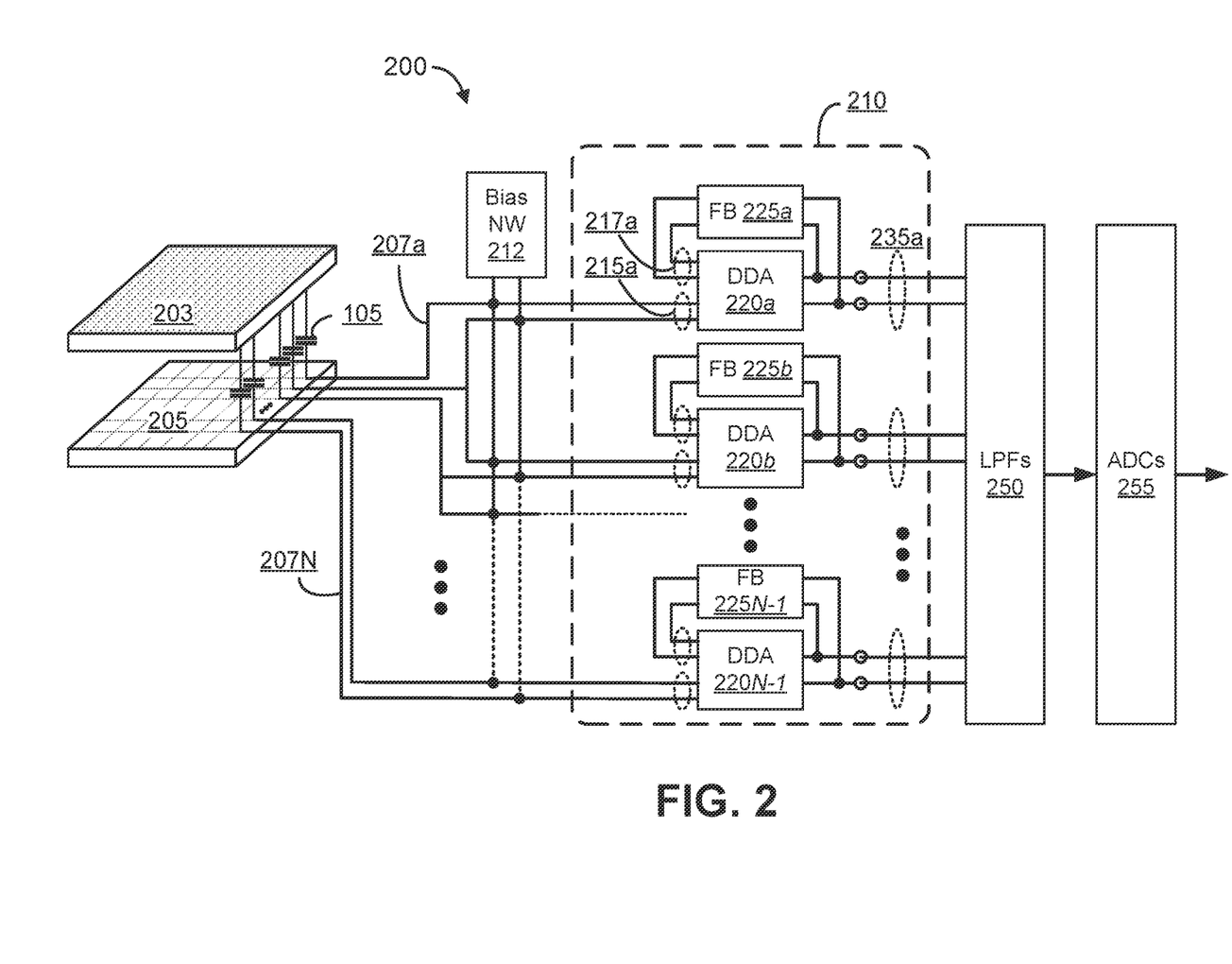
FIG. 2 shows a high-level block diagram of a touch event sensing environment, according to various embodiments described herein.

FIG. 2 shows a high-level block diagram of a touch event sensing environment 200, according to various embodiments described herein. The environment 200 includes a touch event sensing system 210 coupled with touch sensing channels of a touch panel 205. The touch panel 205 can be implemented as the touch panel array 100 of FIG. 1. As described above, the touch panel 205 includes a number of touch sense channels for carrying respective channel response signals 207. Embodiments of the touch event sensing system 210 can receive each channel response signal 207 via a respective row line of each touch sensing channel. The channel capacitance reflected in each channel response signal 207 can be primarily affected by changes in mutual capacitance along the channel (e.g., due to a touch event local to one or more mutual capacitors) and to display noise coupled through the self-capacitors 105.

Embodiments assume a context in which the touch panel 205 is integrated with a display 203, such as a touchscreen display of an electronic device. Noise from the display 203 ("display noise") can be capacitively coupled to the touch panel 205 (e.g., as parasitic capacitance). As illustrated, such capacitively coupled display noise capacitively coupled onto a channel response signal 207 can be modeled as a capacitive response of a corresponding self-capacitor (Cs) 105. The coupled display noise can be different in different regions of the touch panel 205 and can be highly dynamic. However, it is assumed herein that the coupled display noise does not have a lot of local variance, such that it sufficiently consistent between sufficiently proximate touch sensing channels to be treated as common-mode noise and rejected as such. For example, the coupled display noise is substantially the same at any Csrn (e.g., the row-wise self-capacitance of an nth row line) and Csr(n+1) (e.g., the row-wise self-capacitance of an (n+1)th row line, which is next to the nth row line in the touch panel array grid), such that it is common to channel response signal 207n and channel response signal 207(n+1).

Some descriptions herein refer to touch sensing channels n and n+1 (e.g., or components associated with such channels, such as metal lines, mutual capacitors, etc.) as "adjacent." The term "adjacent" in such contexts generally means channels (e.g., or components thereof) which are directly adjacent to each other on the touch panel, within several rows of each other on the touch panel, or otherwise sufficiently proximate to each other so that the display noise coupled to each channel can be treated as common-mode noise for cancelation purposes described herein. Further, while the illustrated implementation shows N channels coupled with N−1 DDAs 220 (illustrated as DDA 220a-DDA 220N−1 in FIG. 2), other implementations do not have a one-to-one correspondence. One such alternative embodiment includes N/2 DDAs 220 to measure N channels in two phases (e.g., half of the channels are measured in each phase).

The touch event sensing system 210 is configured to sense presence or absence of touch events on the touch panel 205 based on measuring the capacitive responses of the touch sensing channels as manifest by the channel response signals 207. Conventional approaches tend to use multiple, sequential stages to measure the capacitive response of each channel separately by buffering and amplifying each channel, and subsequently to subtract the amplified results to remove any display noise. In contexts where the signal range is large, such approaches tend to have several limitations. Embodiments described herein provide a novel touch event sensing system 210 that provides a single-stage approach by using differential difference amplifiers (DDAs) 220 with feedback networks 225 to directly subtract the channel response signals 207 (shown as signals 207a-207N in FIG. 2) for front-end removal of the coupled display noise.

As illustrated, each DDA 220 includes a first differential pair of amplifier inputs 215, a second differential pair of amplifier inputs 217, and differential pair of amplifier outputs 235. Each first differential pair of amplifier inputs 215 receives a respective pair of channel response signals 207 from adjacent touch sensing channels (e.g., corresponding to adjacent row lines of the touch panel 205). For example, each of a nth first differential pair of amplifier inputs 215n receives a respective one of the nth channel response signal 207n and the (n+1)th channel response signal 207(n+1).

Each nth second differential pair of amplifier inputs 217n receives feedback from the nth differential pair of amplifier outputs 235n via a respective feedback network 225n. In a single stage, each nth DDA 220n outputs an amplified version of the capacitive response of the nth channel response signal 207n without the coupled display noise.

Some embodiments can include additional components and/or features. In some embodiments, the channel response signals 207 are received by the touch event sensing system 210 via a biasing network 212. For example, the biasing network 212 includes biasing resistors that bias each first differential pair of amplifier inputs 215 based on a bias voltage. For example, each node by which a channel response signal 207 is received is a high-impedance node, and the biasing network 212 is used to set a voltage for that node (e.g., via a resistor). In some embodiments, the differential pair of amplifier outputs 235 from the touch event sensing system 210 are passed to one or more signal processing blocks. In some such embodiments, as illustrated, the outputs of the touch event sensing system 210 are passed to low-pass filters (LPFs) 250 and/or analog-to-digital converters (ADCs) 255. For example, such embodiments generate one or more digital output signals to indicate the presence or absence of touch events local to the touch sensing channels of the touch panel 205 based on the channel capacitive responses measured by the touch event sensing system 210.

Figure 3:
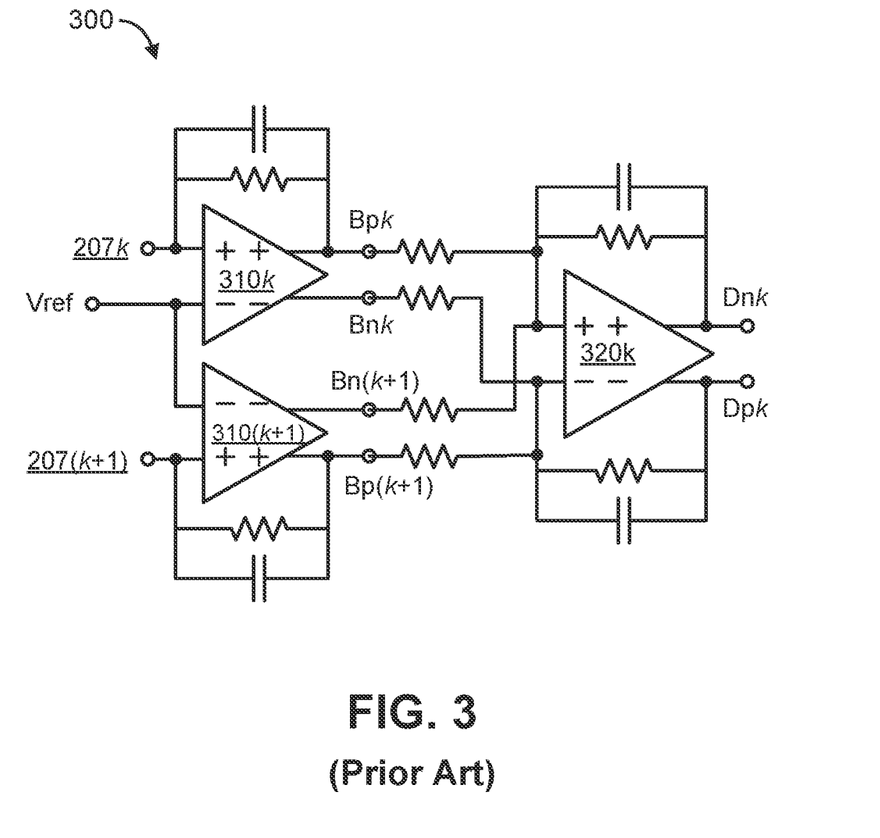
FIG. 3 shows an illustrative circuit diagram of a portion of a conventional touch event sensing system.

For added context, FIG. 3 shows an illustrative circuit diagram of a portion of a conventional touch event sensing system 300. FIG. 3 shows only a portion of the conventional touch event sensing system 300 for measuring two channel response signals 207k and 207(k+1). The conventional touch event sensing system 300 includes two stages. A first stage includes a single-ended buffer 310 for measuring each channel response signal 207. Each single-ended buffer 310 compares its respective channel response signal 207 to a reference voltage (Vref). Each single-ended buffer 310 generates a differential output (Bp, Bn) that is a measured and buffered version of the channel response signal 207, including both the desired signal and the coupled display noise. Typically, the single-ended buffers 310 are configured as unity-gain amplifiers.

A second stage includes a difference amplifier 320 for subtracting the outputs of each pair of single-ended buffer 310. For example, to measure N channels of a touch panel 205, the first stage can include N single-ended buffers 310, and the second stage can include N−1 difference amplifiers 320. In particular, for measuring channel response signal 207k and channel response signal 207(k+1), the first stage can include single-ended buffer 310k and single-ended buffer 310(k+1), and the second stage can include difference amplifier 320k. As illustrated, a positive input of the difference amplifier 320 can receive the positive output of the first single-ended buffer 310k, the negative output of the second single-ended buffer 310(k+1), and feedback from a negative output (Dnk) of the difference amplifier 320; and a negative input of the difference amplifier 320 can receive the negative output of the first single-ended buffer 310k, the positive output of the second single-ended buffer 310(k+1), and feedback from a positive output (Dpk) of the difference amplifier 320.

As the signal range increases, such as from an increase in coupled display noise, such approaches tend not to be effective. For example, when the noise level is high, the single-ended buffers 310 can tend to be saturated. Conventional approaches typically use a saturation detection circuit to detect if the noise saturates the single-ended buffers 310 and can reset the signal, accordingly. Resetting can effectively reduce the signal information available to the touch sensing system and can degrade the signal-to-noise ratio (SNR) at the output. In addition, the use of unity gain buffers followed by a PGA can increase the noise because the buffer does not reduce the PGA equivalent noise, and the output voltage is affected by the noise of the two buffers and the PGA. This can tend to increase power consumption.

Figure 4:
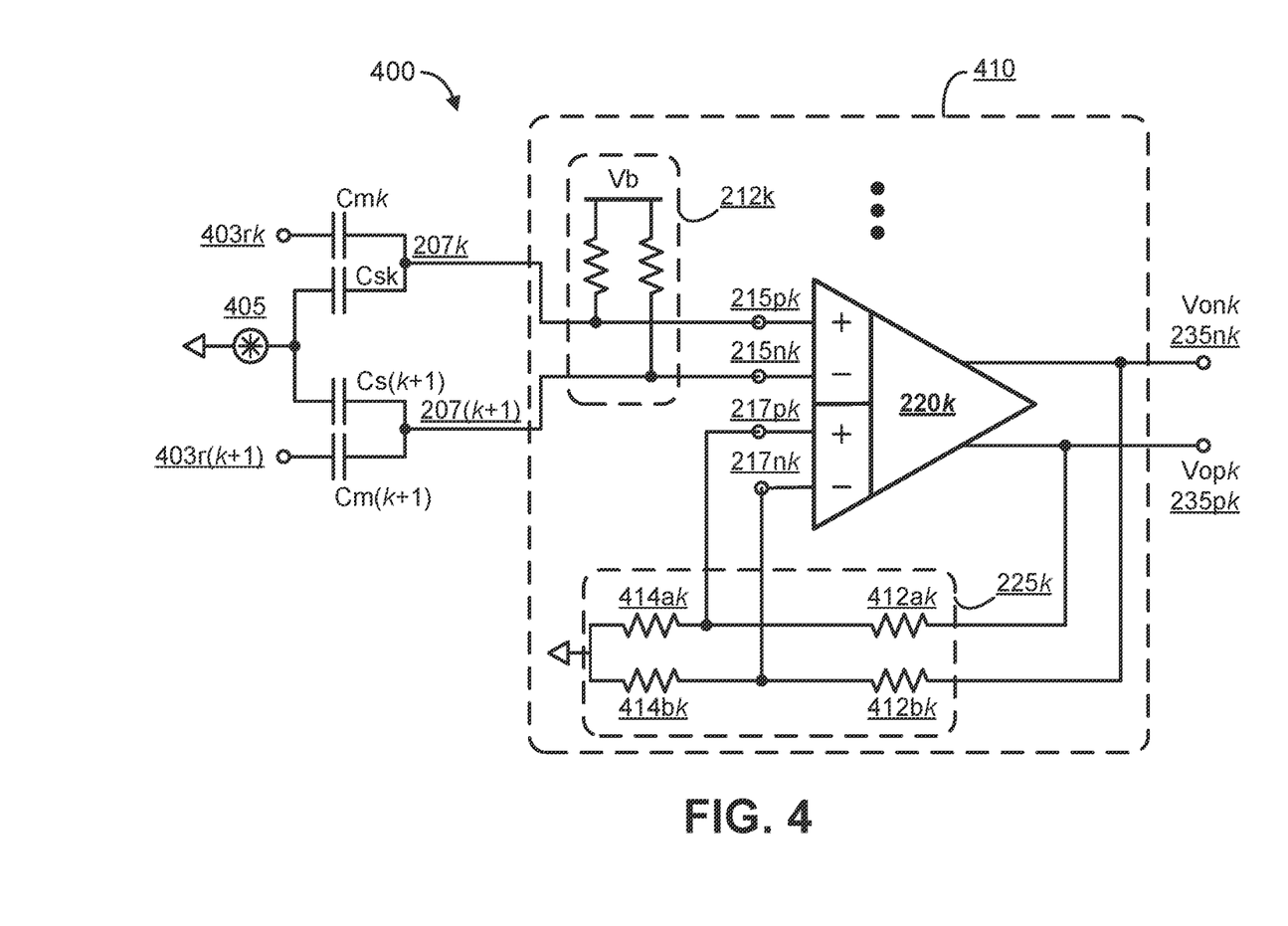
FIG. 4 shows a simplified circuit diagram of a touch sensing environment including a portion of a DDA-based touch event sensing system.

As described above, novel embodiments described herein use a single stage to provide front-end subtraction of common-mode coupled display noise, such that the desired signal is amplified without the display noise. FIG. 4 shows a simplified circuit diagram of a touch sensing environment 400 including a portion of a DDA-based touch event sensing system 410. DDA-based touch event sensing system 410 can be an implementation of a portion of the touch event sensing system 210 of FIG. 2. The illustrated portion of the DDA-based touch event sensing system 410 includes a kth DDA 220k for measuring a kth channel response signal 207k. Although the biasing network 212 is shown in FIG. 2 as separate from the touch event sensing system 210, the biasing network 212 is shown as part of the DDA-based touch event sensing system 410 in FIG. 4. Some implementations of the DDA-based touch event sensing system 410 can include the biasing network 212, and other implementations of the DDA-based touch event sensing system 410 are separate from (and coupled with) the biasing network 212.

Each kth DDA 220k generates a kth differential pair of amplifier outputs 235k based on a kth first differential pair of amplifier inputs 215k, a kth second differential pair of amplifier inputs 217k, and a kth feedback network 225k. The kth differential pair of amplifier outputs 235k includes a positive output 235pk and a negative output 235nk, each to output a respective one of a differential pair of output signals. The differential pair of outputs correspond to an amplified version of a difference between the capacitive response represented by the kth channel response signal 207k and the capacitive response represented by the (k+1)th channel response signal 207(k+1), which is the essentially desired signal portion of the channel response signal 207k with at least a portion (e.g., substantially all) of the coupled display noise canceled.

The kth first differential pair of amplifier inputs 215k includes a kth first positive input 215pk and a first negative input 215nk. The first positive input 215pk is coupled with a kth channel response signal 207k, and the first negative input 215nk is coupled with a (k+1)th channel response signal 207(k+1). As illustrated, each channel response signal 207 for a touch sensing channel can be considered as representing a total channel capacitive response of the channel, which can be a combination of two contributing capacitive responses: capacitive responses to any touch events local to the touch sensing channel as manifest by a change in mutual capacitance (Cm) of the channel; and display noise 405 as capacitively coupled onto the channel response signal 207 as self-capacitance (Cs) of the channel (e.g., as parasitic capacitance). It is assumed that, at least locally, the display noise 405 as coupled via any adjacent channels, as represented by Csk and Cs(k+1), is substantially the same (common-mode noise) for corresponding channel response signals 207k and 207(k+1).

The kth second differential pair of amplifier inputs 217k includes a kth second positive input 217pk and a second negative input 217nk. The kth second positive input 217pk is coupled in feedback with the kth positive output 235pk via a first branch of the kth feedback network 225k. The kth second negative input 217nk is coupled in feedback with the kth negative output 235nk via a second branch of the kth feedback network 225k. In particular, each branch of the kth feedback network 225k includes a voltage divider having a first divider resistor 412 (412ak or 412bk) and a second divider resistor 414 (414ak or 414bk). In the first branch, the first divider resistor 412ak is coupled between the kth positive output 235pk and a first divider node, the second divider resistor 414ak is coupled between the first divider node and a reference node (e.g., ground), and the kth second positive input 217pk is coupled with the first divider node. In the second branch, the first divider resistor 412bk is coupled between the kth negative output 235nk and a second divider node, the second divider resistor 414bk is coupled between the second divider node and the reference node, and the kth second negative input 217nk is coupled with the second divider node. In the illustrated implementation, the second divider resistors 414ak and 414bk are coupled with ground. Alternatively, the second divider resistors 414ak and 414bk can be coupled with a different reference node (i.e., at a non-ground reference voltage level); or the second divider resistors 414ak and 414bk can be coupled together, so that the reference node is floating.

In effect, because essentially the same coupled display noise is coupled with each of the first differential pair of amplifier inputs 215, the DDA 220 immediately converts coupled display noise to a common-mode signal and rejects it in its generated differential pair of amplifier outputs 235, accordingly. The fed-back differential output signals represent only (or substantially only) the desired portion of the channel response signal 207, and that desired portio is amplified, accordingly. For example, if the first divider resistor 412 in each branch has a value of Rf, and the second resistor 414 is each branch has a value of Ri, each differential output 235 is fed back to a respective one of the second differential pair of amplifier inputs 217 at a gain of 1+(Rf/Ri).

Figure 5:
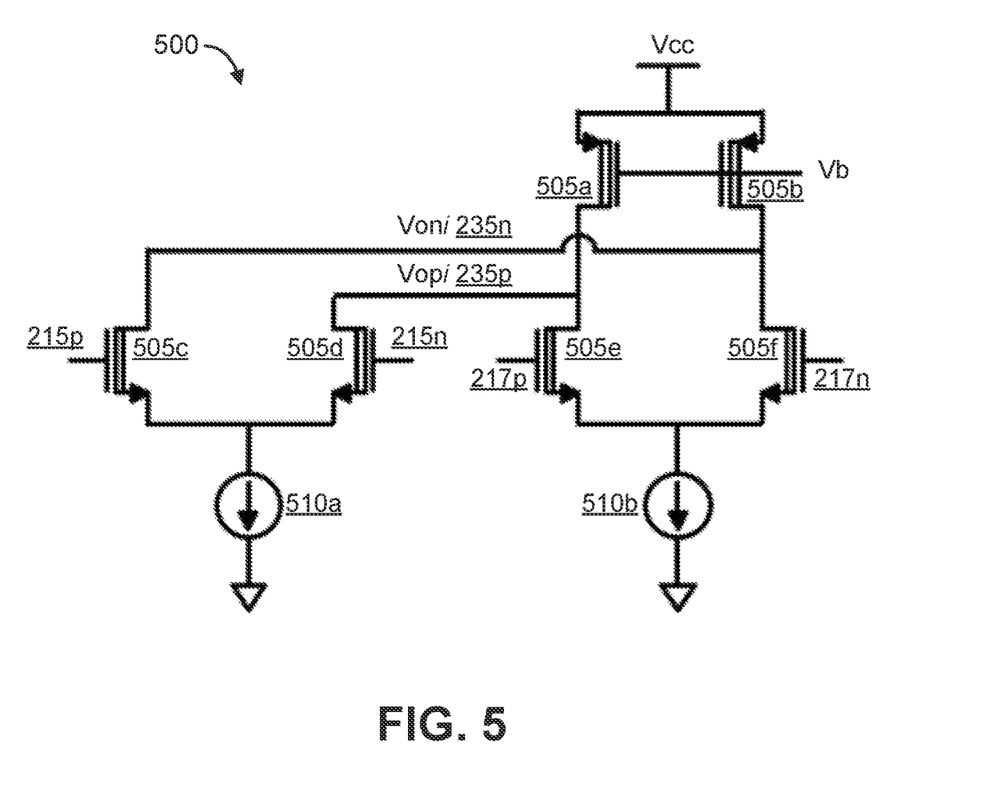
FIG. 5 shows an illustrative complementary metal-oxide semiconductor (CMOS) circuit for implementing a DDA for use in the DDA-based touch event sensing system of FIG. 4.

FIG. 5 shows an illustrative complementary metal-oxide semiconductor (CMOS) circuit 500 for implementing a DDA 220 for use in the DDA-based touch event sensing system 410 of FIG. 4. The CMOS circuit 500 includes three pairs of transistors 505, such as field-effect transistors (FETs). A first pair of transistors 505 includes a first transistor 505a that is coupled between a source voltage (Vcc) and a positive output 235p (i.e., of the differential pair of amplifier outputs 235) and is biased by a bias voltage, and a second transistor 505b that is coupled between the source voltage and a negative output 235n and is biased by the bias voltage. A second pair of transistors 505 includes a third transistor 505c that is coupled between the negative output 235n and a first tail current source 510a and is biased by the first positive input 215p (i.e., of the first differential pair of amplifier inputs 215), and a fourth transistor 505d that is coupled between the positive output 235p and the first tail current source 510a and is biased by the first negative input 215n. The third pair of transistors 505 includes a fifth transistor 505e that is coupled between the positive output 235p and a second tail current source 510b and is biased by the second positive input 217p (i.e., of the second differential pair of amplifier inputs 217), and a sixth transistor 505f that is coupled between the negative output 235n and the second tail current source 510b and is biased by the second negative input 217n.

Figure 6:
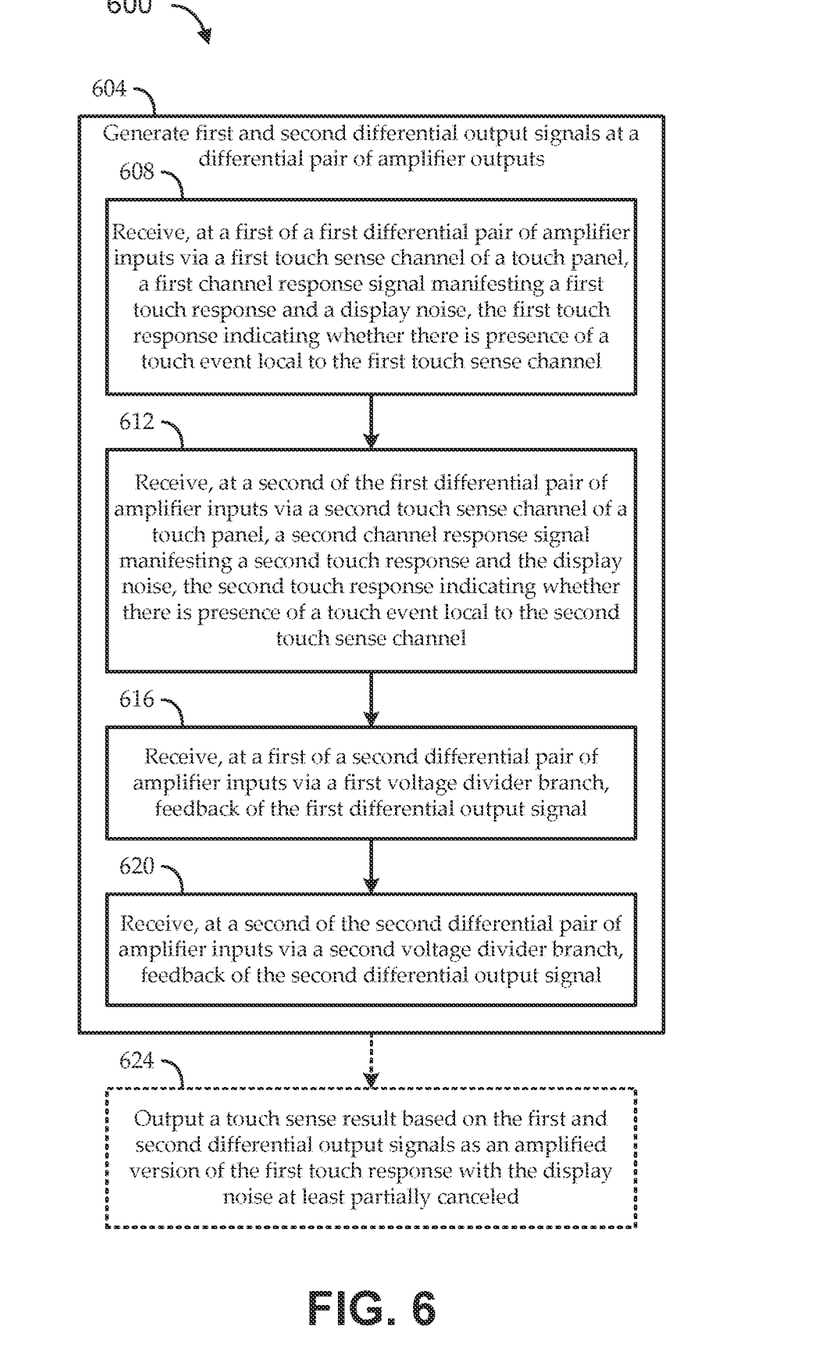
FIG. 6 shows a flow diagram of an illustrative method for touch event sensing in a touch panel, according to embodiments described herein.

FIG. 6 shows a flow diagram of an illustrative method 600 for touch event sensing in a touch panel, according to embodiments described herein. The method 600 operates in context of a capacitive touch panel that is integrated with a display. The capacitive touch panel includes a number of row and column lines arranged in a grid to form touch sensing channels. When a channel response signal is transmitted through a touch sensing channel, the signal is affected by the capacitive response of the channel, which can include contributions both from one or more channel capacitors (e.g., a row-column mutual capacitor) and from self-capacitance to the display. The capacitive response of the one or more channel capacitors changes depending on whether there is presence of a local touch event. For example, a mutual capacitor manifests a first capacitance in the absence of a local touch event and manifests a second, different (e.g., higher or lower) capacitance in presence of a local touch event. The capacitive response of the parasitic capacitance is based on capacitively coupled display noise. As such, the channel response signal passing through any touch sensing channel is affected both by the presence or absence of a local touch event (i.e., the desired signal) and by display noise. As described herein, it is assumed that the display noise at proximate (e.g., adjacent) touch sensing channels is sufficiently identical to be treated as common-mode noise.

Embodiments of the method 600 can begin at stage 604 by generating first and second differential output signals at a differential pair of amplifier outputs. The method 600 seeks to generate the differential output signals as an amplified version of the desired signal (e.g., the signal carrying the touch sense information) with as much of the display noise canceled out as possible. As described herein, the generating can at stage 604 can be performed by a DDA-based touch event sensing system that uses a single stage to effectively pre-cancel the capacitively coupled display noise by common-mode rejection so as to amplify only (or substantially only) the desired portion of the signal. The generating at stage 604 can be implemented by stages 608-620.

At stage 608, embodiments of the method 600 can receive a first channel response signal manifesting a first touch response and a display noise. The receiving at stage 608 can be by a first of a first differential pair of amplifier inputs via a first touch sense channel of a touch panel. The first touch response can indicate whether there is presence of a touch event local to the first touch sense channel. At stage 612, embodiments can receive a second channel response signal manifesting a second touch response and the display noise. The receiving at stage 612 can be by a second of the first differential pair of amplifier inputs via a second touch sense channel of a touch panel. The second touch response indicating whether there is presence of a touch event local to the second touch sense channel. In some embodiments, the first touch sense channel corresponds to a first row line of a grid of row lines and column lines of the touch panel, and the second touch sense channel corresponds to a second row line that is directly adjacent to the first row line of the grid of row lines and column lines of the touch panel. In some embodiments, the receiving at stage 608 is via a first branch of a biasing network coupled with a bias voltage, and the receiving at stage 612 is via a second branch of the biasing network coupled with the bias voltage.

At stage 616, embodiments of the method 600 can receive feedback of the first differential output signal. The receiving at stage 616 can be by a first of a second differential pair of amplifier inputs via a first voltage divider branch. At stage 620, embodiments can receive feedback of the second differential output signal. The receiving at sage 620 can be by a second of the second differential pair of amplifier inputs via a second voltage divider branch.

In some embodiments, at stage 624, the method 600 can output a touch sense signal. In some such embodiments, the touch sense signal is the first and second differential output signals, which includes an amplified version of the first touch response with the display noise at least partially canceled. In other such embodiments, the differential outputs are further processed by one or more stages (e.g., by a low-pass filter, an analog-to-digital converter, etc.), resulting in the touch sense signal output at stage 624.

In some embodiments, the method 600 is performed N−1 times for N touch sensing channels of the touch panel. For example, the generating at stage 604 includes generating N−1 first and second differential output signals at N−1 differential pairs of amplifier outputs. In such embodiments, for each nth first and second differential output signals: the receiving at stage 608 includes receiving an nth channel response signal at a first of an nth first differential pair of amplifier inputs via an nth touch sense channel of the touch panel; the receiving at stage 612 includes receiving an (n+1)th channel response signal at a second of the nth first differential pair of amplifier inputs via a (n+1)th touch sense channel of the touch panel; the receiving at stage 616 includes receiving feedback of the nth first differential output signal at a first of an nth second differential pair of amplifier inputs via an nth first voltage divider branch; and the receiving at stage 620 includes receiving feedback of the nth second differential output signal at a second of the nth second differential pair of amplifier inputs via an nth second voltage divider branch.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A system for sensing a touch event in a touch panel integrated with a display, the system comprising:
 a differential difference amplifier (DDA) comprising:
  a differential pair of amplifier outputs having a positive output node and a negative output node, each to output a respective one of a differential pair of output signals;
  a first differential pair of amplifier inputs having a first positive input and a first negative input, the first positive input coupled with a first channel response signal corresponding to a first capacitive response of a first channel capacitor combined with coupled display noise, and the first negative input coupled with a second channel response signal corresponding to a second capacitive response of a second channel capacitor combined with the coupled display noise;
  a second differential pair of amplifier inputs having a second positive input and a second negative input;
  first transistors all having drains coupled with the negative output node, and second transistors all having drains coupled with the positive output node, wherein:
   each of a first transistor of the first transistors and a first transistor of the second transistors has a source coupled with a source voltage and is biased by a bias voltage;
   each of a second transistor of the first transistors and a second transistor of the second transistors has a source coupled with a first tail current source and is biased by a respective one of the first differential pair of amplifier inputs; and
   each of a third transistor of the first transistors and a third transistor of the second transistors has a source coupled with a second tail current source and is biased by a respective one of the second differential pair of amplifier inputs.

2. The system of claim 1, further comprising:
 a touch panel interface to couple the first positive input of the DDA with a first mutual capacitor and to couple the first negative input of the DDA with a second mutual capacitor of a touch panel, each mutual capacitor coupled with a respective touch panel channel to manifest a first capacitance in absence of a local touch event on the touch panel and to manifest a second capacitance in presence of the local touch event on the touch panel.

3. The system of claim 1, further comprising:
 N−1 DDAs,
 wherein the touch panel comprises N touch sense channels to generate N channel response signals, each nth DDA of the N−1 DDAs having its respective first positive input coupled with an nth channel response signal of the N channel response signals and having its respective second positive input coupled with an (n+1)th channel response signal of the N channel response signals, N being an integer greater than 1.

4. The system of claim 3, wherein:
 the touch panel comprises a grid of column lines and row lines, the channel response signals being transmitted via the column lines and received via the row lines, such that each nth channel response signal is received via a respective nth row line, and each (n+1)th channel response signal is received via a respective (n+1)th row line that is adjacent to the nth row line in the grid.

5. The system of claim 1, further comprising:
 a bias network comprising a pair of bias resistors, each coupled between a bias voltage and a respective one of the first differential pair of amplifier inputs.

6. The system of claim 1, further comprising:
 a feedback network comprising:
  a first voltage divider having a first resistor coupled between the negative output and a first divider node, and a second resistor coupled between the first divider node and a reference node; and
  a second voltage divider having a third resistor coupled between the negative output and a second divider node, and a fourth resistor coupled between the second divider node and the reference node,
 wherein the first divider node is coupled with the second negative input, and the second divider node is coupled with the second positive input, and
 wherein the first and third resistors are nominally identical, and the second and fourth resistors are nominally identical.

7. The system of claim 1, further comprising:
 a low-pass filter coupled with the differential pair of amplifier outputs; and
 an analog-to-digital converter coupled with the low-pass filter.

8. A display system comprising:
 a touch panel for integration with a display, the touch panel comprising N touch sense channels formed by a grid of row lines and column lines, each nth touch sense channel manifesting an nth capacitive response to presence of a touch event local to the nth touch sense channel, N being an integer greater than 1; and
 N−1 differential difference amplifiers (DDAs), each nth DDA comprising:
  an nth differential pair of amplifier outputs having an nth positive output node and an nth negative output node, each to output a respective one of an nth differential pair of output signals;
  an nth first differential pair of amplifier inputs having an nth first positive input and an nth first negative input, the nth first positive input to receive, via the nth touch sense channel, an nth channel response signal indicating the nth capacitive response combined with coupled display noise, and the nth first negative input to receive, via the (n+1)th touch sense channel, an (n+1)th channel response signal indicating the (n+1)th capacitive response combined with coupled display noise;
  an nth second differential pair of amplifier inputs having an nth second positive input and an nth second negative input; and nth first transistors all having drains coupled with the negative output node, and nth second transistors all having drains coupled with the positive output node, wherein:
- each of a first transistor of the nth first transistors and a first transistor of the nth second transistors has a source coupled with a source voltage and is biased by a bias voltage;
- each of a second transistor of the nth first transistors and a second transistor of the nth second transistors has a source coupled with a first tail current source and is biased by a respective one of the nth first differential pair of amplifier inputs; and
- each of a third transistor of the nth first transistors and a third transistor of the nth second transistors has a source coupled with a second tail current source and is biased by a respective one of the nth second differential pair of amplifier inputs.

9. The display system of claim 8, further comprising: the display.

10. The display system of claim 8, wherein each nth touch sense channel is coupled with an nth mutual capacitor and manifests the nth capacitive response based on the nth mutual capacitor manifesting a first capacitance in absence of the touch event local to the nth touch sense channel and manifesting a second capacitance in presence of the touch event local to the nth touch sense channel.

11. The display system of claim 8, wherein each nth channel response signal is received via a respective nth row line, and each (n+1)th channel response signal is received via a respective (n+1)th row line that is adjacent to the nth row line in the grid.

12. The display system of claim 8, wherein the nth first differential pair of amplifier inputs of each nth DDA is coupled in parallel with the nth touch sense channel and with a bias resistor network.

13. The display system of claim 8, wherein each nth DDA further comprises:
- an nth feedback network comprising:
  - an nth first voltage divider having an nth first resistor coupled between the nth negative output and an nth first divider node, and an nth second resistor coupled between the nth first divider node and a reference node; and
  - an nth second voltage divider having an nth third resistor coupled between the nth positive output and an nth second divider node, and an nth fourth resistor coupled between the nth second divider node and the reference node,
- wherein the nth first divider node is coupled with the nth second negative input, and the nth second divider node is coupled with the nth second positive input, and
- wherein the nth first and third resistors are nominally identical, and the nth second and fourth resistors are nominally identical.

\* \* \* \* \*